United States Patent [19]
Yoshigai

[11] Patent Number: 5,338,973
[45] Date of Patent: Aug. 16, 1994

[54] CARRIER FOR FILM CARRIER TYPE SEMICONDUCTOR DEVICE

[75] Inventor: Akira Yoshigai, Tokyo, Japan

[73] Assignee: Nec Corporation, Japan

[21] Appl. No.: 146,806

[22] Filed: Nov. 1, 1993

Related U.S. Application Data

[63] Continuation of Ser. No. 747,685, Aug. 20, 1991, abandoned.

[30] Foreign Application Priority Data

Aug. 22, 1990 [JP] Japan .................. 2-220207

[51] Int. Cl.⁵ .............. H01L 23/48; H01L 21/60
[52] U.S. Cl. ..................... 257/668; 257/669; 257/670; 257/671; 257/676
[58] Field of Search ............... 357/72, 80, 68; 257/666, 668, 670, 676, 669, 671

[56] References Cited

U.S. PATENT DOCUMENTS

| | | | |
|---|---|---|---|
| 4,435,724 | 3/1984 | Ralstin | 357/80 |
| 4,536,786 | 8/1985 | Hayakawa et al. | 357/80 |

FOREIGN PATENT DOCUMENTS

| | | |
|---|---|---|
| 59-72746 | 4/1984 | Japan . |
| 61-90453 | 5/1986 | Japan . |
| 2-206140 | 8/1990 | Japan . |

*Primary Examiner*—Viet Q. Nguyen
*Attorney, Agent, or Firm*—Laff, Whitesel, Conte & Saret

[57] ABSTRACT

An opening is formed at the central part of a substrate, and a recessed part for holding a film carrier type IC is formed in the periphery of the opening. Fixing hooks are provided in the recessed part that are mutually opposed with the opening in between. In particular, the projections in the upper part of the fixing hooks are tapered to facilitate the insertion of the fixing hooks to the sprocket holes.

12 Claims, 4 Drawing Sheets

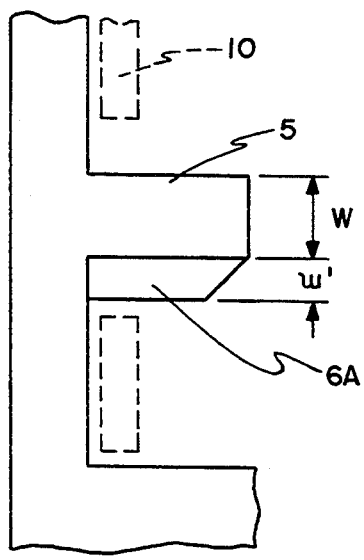
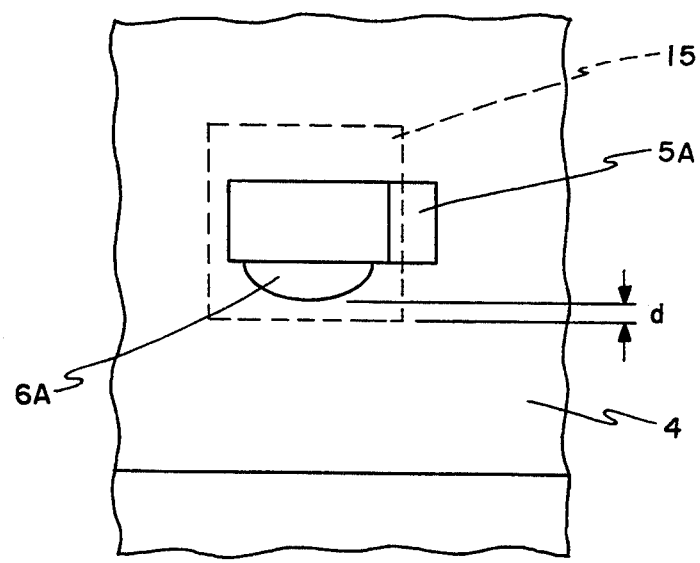
FIG. 3B  FIG. 3A
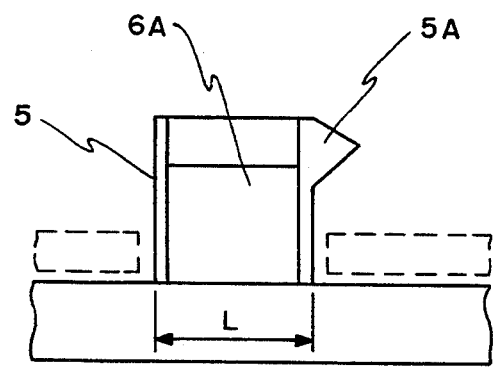
FIG. 3C

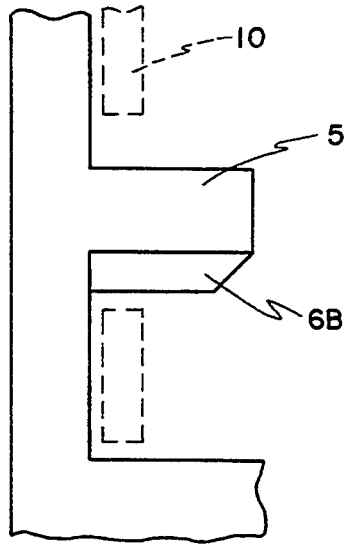
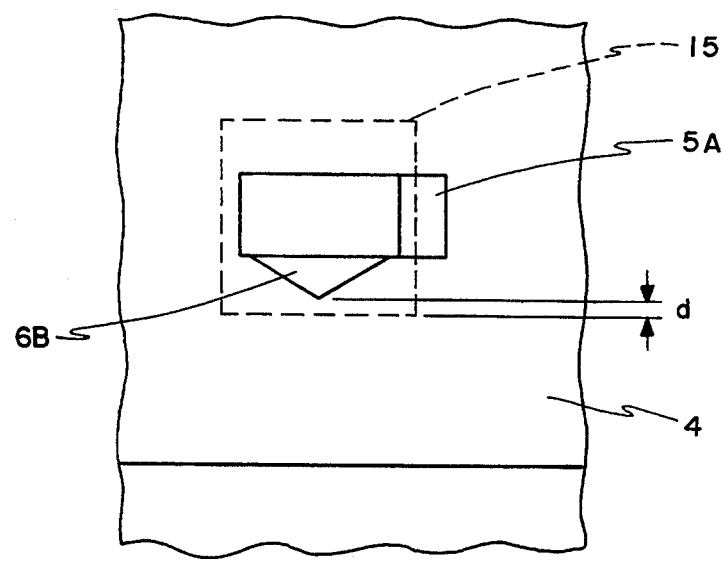
FIG. 4B        FIG. 4A
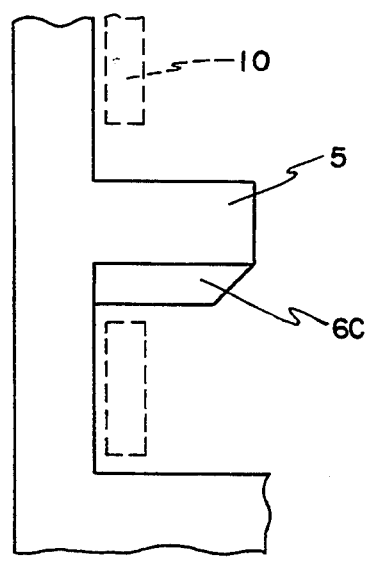
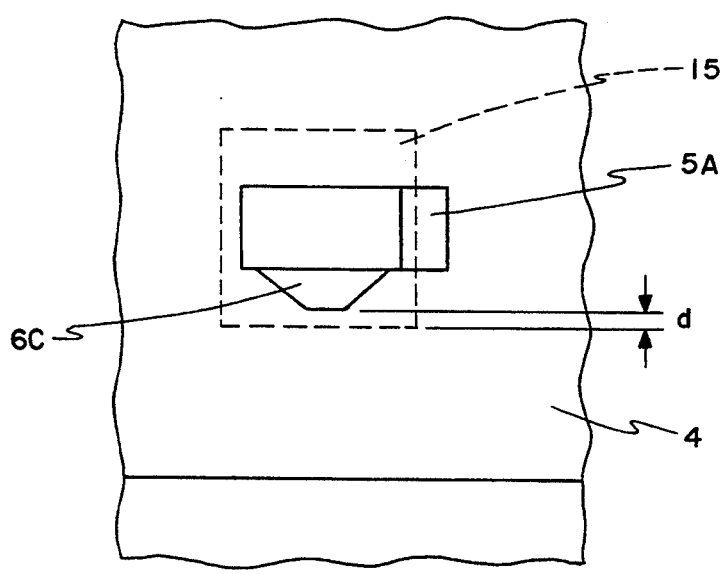
FIG. 5B        FIG. 5A

CARRIER FOR FILM CARRIER TYPE SEMICONDUCTOR DEVICE

This application is a continuation of application Ser. No. 07/747,685, filed Aug. 20, 1991, abandoned.

BACKGROUND OF THE INVENTION

1. Field of the Invention

The present invention relates to a carrier for film carrier type semiconductor device, and more particularly, to a carrier which holds a film carrier type semiconductor device by engaging the fixing hooks with the sprocket holes of the film carrier.

2. Description of the Prior Art

The fabrication process of a film carrier type semiconductor device (IC) is roughly as in the following. First, a foil of metal such as copper is attached on an insulating base film made of a flexible resin such as polyimide having sprocket holes for conveyance and positioning and a device hole for housing a semiconductor chip, and leads and pads for electrical selection with desired shapes are formed by patterning the metallic foil to constitute a film carrier. Next, a semiconductor chip having metallic protrusions (bumps) formed in advance on the electrode terminals, is prepared, followed by the bonding of the leads of the film carrier and the bumps of the semiconductor chip by means of thermocompression or eutectic welding, completing a film carrier type IC.

A film carrier type IC formed as in the above is subjected to electrical selection or bias test which is carried out through contacts that make contact with the pads of the film carrier tape. In preparation for these types of test the semiconductor chip may be resin sealed by potting of resin for the purpose of assuring the reliability and protecting it from mechanical shocks.

In mounting the film carrier type IC on a printed board, the leads are cut to desired lengths, the semiconductor chip is fixed onto the printed board, then the leads are outer-bonded to the bonding pads formed on the printed board.

For a film carrier type IC, it is possible to perform bonding simultaneously regardless of the number of the leads as described above so that the bonding speed can be made high. Moreover, the IC is of a tape type film carrier so that it is easier to automate the working, and it is small-sized, thin and light-weight compared with other semiconductor devices.

However, the film carrier type IC has a defect that deformation or silvering tend to be generated in the leads formed on its surface because of the flexibility of the base film that constitutes the film carrier. In order to eliminate the defect by mechanically protecting and reinforcing the film carrier type ICs, after cutting the film carrier type ICs into individual pieces, each piece of the cut film carrier type IC is generally mounted on a carrier for IC (referred to simply as a carrier hereinafter) when the IC is subjected to the fabrication processes such as resin sealing and electrical selection, or shipped.

The conventional carrier comprises a square substrate made of resin or the like, an opening formed at the central part of the substrate, a recessed part for holding a film carrier type IC formed in the periphery of the opening, fixing hooks to be inserted to the sprocket holes of the film carrier tape formed in the recessed part placed facing each other with the opening in between, a direction displaying notch formed at one of the corners of the substrate, first holes for letting pins pass through in alignment with the sprocket holes of the film carrier for positioning of the IC, second holes for letting pins pass through, when needed, in alignment with the tooling holes formed in the base film, carrier fixing notches formed in the periphery of the substrate for positioning the carrier, and the like. Among carriers constituted as in the above, there are a type which completely fixes the IC and a type which holds the IC in a state that permits a movement, though only slightly, when a film carrier type IC is mounted on the carrier.

In a carrier of the type where the film carrier type IC is completely fixed with fixing hooks, the positioning of the contacts and the IC pads has to be carried out by means of the carrier fixing notches, so that there is a defect that the positioning accuracy is unsatisfactory. In contrast, in a carrier of the type where the film carrier type IC is held with a margin for movement, a rough alignment of the contacts and the pads is done by means of the carrier fixing notches, and the final positioning can be accomplished by letting the pins go through the sprocket holes on the tooling holes of the film carrier. Consequently, the carrier of the type with a margin for movement is generally being used in widespread manner. It is to be mentioned that the "margin for movement" when a film carrier type with 35 mm width is employed is 0.05 to 0.15 mm.

The fixing hooks provided in the carrier are either provided with a size having the above-mentioned margin so as to be positioned at the approximate centers of the sprocket holes, or given a construction in which the width of the fixing hooks is chosen small and the centers of the fixing hooks are shifted to the outside of the centers of the sprocket holes, that is, so as to prevent an increase in the margin by giving a larger spacing between the opposing fixing holes.

However, the carrier according to the prior art described in the above has a drawback in that when the fixing hooks are inserted to the sprocket holes, the projections formed in their upper parts tend to deform the sprocket holes. In particular, when the width of the fixing hooks is large, the deformation of the sprocket holes by the hooks is large so that they damage the sprocket holes or deform the leads. However, if the width of the fixing hooks is made small as a measure against the sprocket hole, the margin between the fixing hooks and the sprocket holes becomes large, although the deformation of the sprocket holes at the time of insertion of the fixing hooks can be made small, and There may arise cases in which the positioning holes are damaged by the positioning pins at the time of insertion of the pins to the sprocket holes or the tooling holes, making it impossible to obtain an accurate positioning. When the margin is reduced by shifting the fixing hooks toward the outside, the deformation in the sprocket holes at the time of insertion of the fixing hooks becomes large as has been stated in the above.

As a measure against this, in Japanese Patent Laid Open No. 59-72746 and Japanese Patent Laid Open No. 61-90453 have two-piece type carriers which employ two sheets of carriers that have respectively male and female fixing hooks, and are used by sandwiching a film carrier type IC between them. This case, however has a defect in that it leads to an increase in cost because the manufacture of two sheets of carriers must have similar shapes.

SUMMARY OF THE INVENTION

It is an object of the present invention to provide a carrier for film carrier type IC which enables a reduction in the damages to the sprocket holes and the deformations of the leads by minimizing the deformation of the film carrier which tends to be generated in mounting the film carrier type IC.

The carrier for film carrier type IC according to the present invention has a square opening at the central part of a square substrate made of a resin or the like. In the periphery of the opening there is formed a recessed part for holding the film carrier type IC. In addition, in the recessed part, there are fixing hooks, having a projection from the upper part of each of them. The projections are facing each other with the opening in between to be inserted to the sprocket holes of the film carrier. Further, carrier fixing notches are formed in the periphery of the substrate, and a direction orienting notch is provided at one corner of the substrate.

In particular, on the mutually opposing surfaces, or on their rear surfaces, of the pair of fixing hooks, there are provided protrusions for controlling the spacing between the sprocket holes and the fixing hooks. Further, a taper is given to each of the projections that are formed in the upper parts of the fixing hooks. In mounting the film carrier type IC on the carrier that has the fixing hooks constructed as in the above, the fixing hooks are inserted to the sprocket holes of the film carrier. At this time, the insertion of the fixing hooks can be made smoothly and no deformation will be generated in the sprocket holes since a taper is provided to the projections of the fixing hooks. Further, even if the width of the fixing hooks is made small enough to reduce the deformation of the sprocket holes at the time of the insertion, the margin between the fixing hooks and the sprocket holes will not be made too large since protrusion are provided on the side faces of the fixing hooks.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 3(A) to FIG. 3(C) are a top view, a side view and a front view, respectively, of the neighborhood of the fixing hook of the first embodiment;

FIG. 4(A) and FIG. 4(B) are a top view and a side view, respectively, of the neighborhood of the fixing hook of a second embodiment of the present invention; and FIG. 5(A) and FIG. 5(B) are a top view and a side view, respectively, of the neighborhood of the fixing hook of a third embodiment of the present invention.

DETAILED DESCRIPTION OF THE PREFERRED EMBODIMENTS

Figure 1:
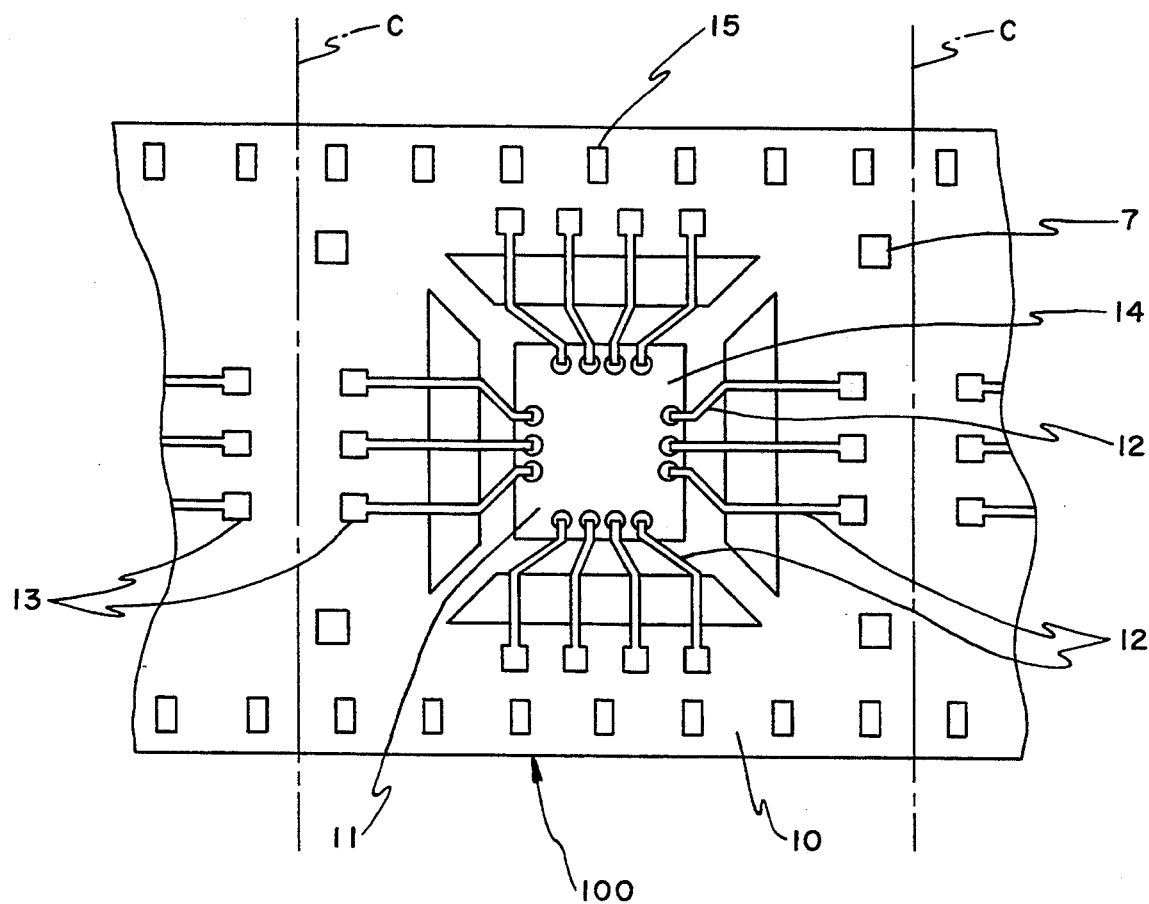
FIG. 1 is a plan view of a film carrier type IC to be mounted on the carrier according to the present invention.

Referring to FIG. 1, the film carrier type IC according to the present invention can be fabricated by providing, on an insulating base film made of polyimide or the like, a device hole 11 for housing a semiconductor chip 14, sprocket holes 15 and tooling holes 7 for conveyance and positioning, and the like, then forming connection leads 12 to pads 13 by patterning a metallic foil formed by deposition on the film, and bonding bumps of the semiconductor chip 14 that has bumps on electrode terminals and the tips of the leads 12 by thermocompression or eutectic welding.

The film carrier type ICs thus constructed are cut along cutting lines C to individual chips, and are mounted on the carrier of the present invention for the purpose of mechanical protection and reinforcement.

Figure 2A:
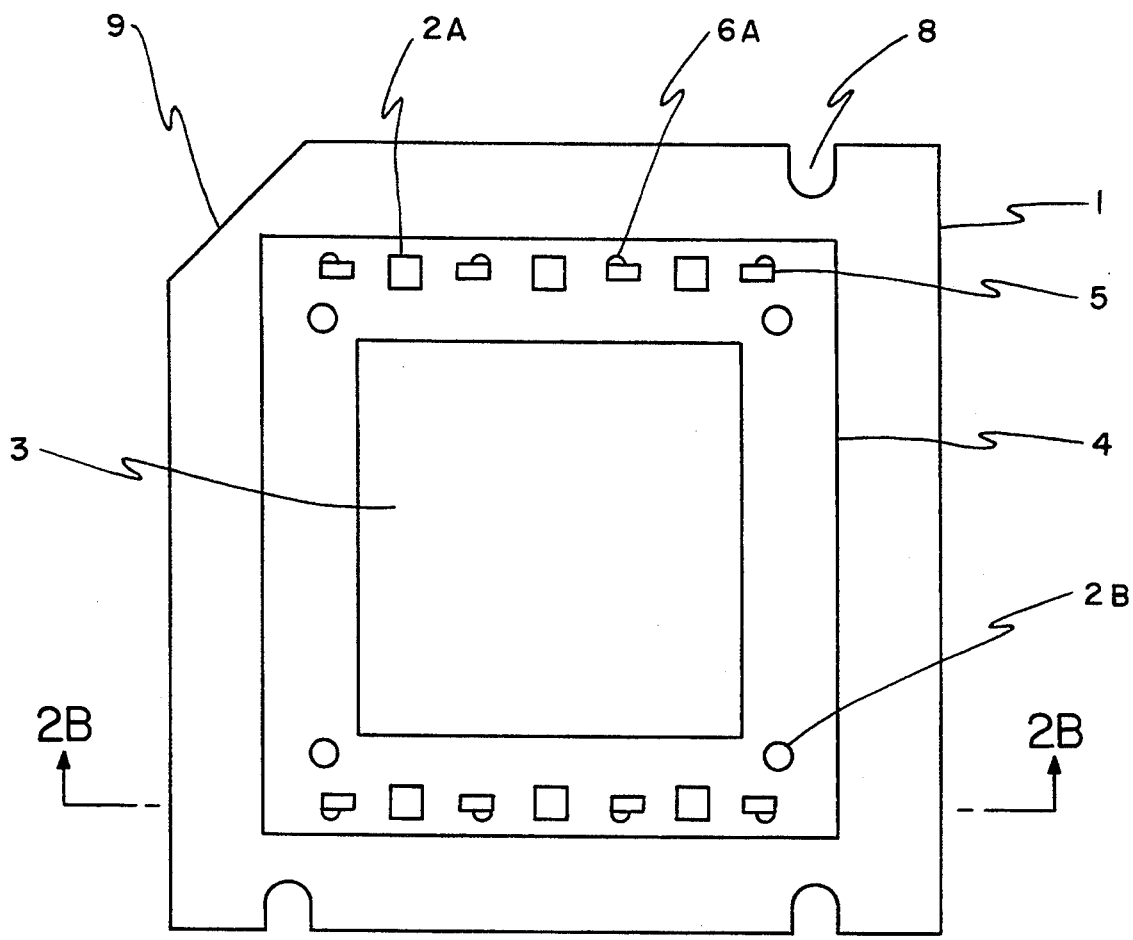
FIG. 2(A) and FIG. 2(B) are a plan view of a first embodiment of the present invention and its sectional view along the line A—A of the plan view, respectively.
Figure 2B:
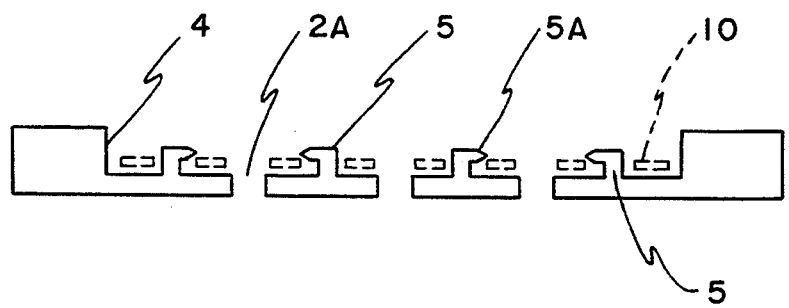

Referring to FIGS. 2(A) and 2(B), the first embodiment of the carrier according to the present invention comprises of a square substrate 1 made of a resin or the like which has an opening 3 in its central part. In the circumference of the opening 3 there is formed a recessed part 4 for holding the base film 10 of the film carrier type IC. In the recessed part 4 there are provided a plurality of fixing hooks 5 that stand opposite with each other the opening 3 in between, first holes 2A that are aligned with the sprocket holes of the film carrier and second holes 2B that are aligned with the tooling holes. Further, carrier fixing notches 8 and a direction orienting notch 9 are provided along the circumference of the substrate 1.

Referring to FIG. 3(A) to FIG. 3(C), the fixing hook 5 is formed so as to have its center to be coincident with the center of the sprocket hole 15 of the base film 10 and its width W to be about one-third of the width of the sprocket hole 15. Since the fixing hook 5 is situated at the central part of the sprocket hole 15 which facilitates the deformation of the sprocket hole and the width of the fixing hook is made small, the possibility of generating a damage to the sprocket hole 15 and a deformation in the lead at the time of holding IC 10 can be reduced.

Moreover, on the rear side of each of the pair of mutually opposing surfaces there is provided a protrusion 6A by the thickness w' with a taper in its upper part and having a semicircular cross-sectional shape. Because of this, even if the width W of the fixing hook 5 is made small, the margin for IC 10 and the carrier, that is, the spacing d between the sprocket hole 15 and the fixing hook 5 can be controlled freely. In other words, the protrusion 6A controls the spacing d to be in the range of 0.05 to 0.15 mm so as not to give damage to the tooling hole 7 or the sprocket hole 15 by the positioning pins at the time of positioning of IC 10. Moreover, the protrusion 6A is provided at a position where it will not be brought into contact with the edge of the sprocket hole 15 even if the sprocket hole 15 is deformed by the projection 5A of the fixing hook 5. After IC 10 is held by the carrier the protrusion 6A controls the movement of the sprocket hole 15, that is, IC 10, and suppresses the spacing d from becoming unnecessarily large.

As a result of bringing the centers of the fixing hooks 5 to be coincident with the centers of the sprocket holes 15, and selecting the width W of the fixing hook to be 0.5 mm and its length L to be 1.3 mm, and the thickness w' of the protrusion 6A to be 0.35 mm, for IC 10 that has sprocket holes 15 of 1.42 mm square, it was confirmed that the resistance at the time of insertion of IC 10 to the carrier can be reduced and damage to the sprocket holes 15 and deformation of the leads 12 are hardly observable. Further, the margin between IC 10 and the carrier is also within a proper range, and no erroneous contact in the electrical selection or the like is generated.

Moreover, the projection 5A in the upper part of the fixing hook 5 is tapered to avoid the application of a sudden and large force to the sprocket hole part at the time of insertion of the fixing hook, as shown in FIG. 3(C), so that the insertion of the fixing hooks 5 to the sprocket holes 15 can be facilitated. As a result of an evaluation, it was found that there will not be applied a sudden and large force to the sprocket hole part at the time of insertion of the fixing hooks, and the time during which the sprocket holes are deformed can be made very short, as long as the angle of the taper is in the range of 20 to 40 degrees. Therefore, damage to the sprocket holes and deformation of the leads 12 can be further reduced by giving a taper to the projections 5A to have the taper angle in the above-mentioned range.

In the above, the first embodiment has been described with reference to the case where the corner sections at the tip of the projection 5A has a rectangular shape as shown in FIG. 3(A), but the corner section may be given a rounded shape. By so doing, the force that is applied to the sprocket hole at the time of insertion of the fixing hook 5 can further be reduced.

Referring to FIG. 4(A) and FIG. 4(B), in the second embodiment according to the present invention, the protrusion 6B that is formed on a side face of the fixing hook 5 has a triangular cross-section. The remainder of the construction is the same as in the first embodiment. The protrusion 6B for the second embodiment can also properly control the spacing d between the fixing hook and the sprocket hole.

Referring to FIG. 5(A) and FIG. 5(B), the protrusion 6C of the third embodiment according to the present invention has a trapezoidal cross-section. Since the spacing d between the tip of the tropezoidal protrusion 6C and the edge of the sprocket hole 15 can be controlled properly also in the third embodiment, it is possible to reduce the generation of damage to the sprocket hole and deformation of the leads 12.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A carrier for mounting a film carried type of semiconductor device, said semiconductor device having an insulating base film in which a plurality of sprocket holes are formed, said carrier comprising:
a substrate having an upper surface;
a recess formed in part of said substrate and extending downwardly from said upper surface, said recess providing menas for holding said film carrier type semiconductor device;
an opening formed in said recess;
a first fixing hook array comprising a plurality of fixing hooks, extending in a first direction and being formed on said recess; and
a second fixing hook array comprising a plurality of fixing hooks extending in said first direction and formed on said recess, said second fixing hook array being separated from said first fixing hook array by a distance interposing said opening, said distance extending in a second direction which is perpendicular to said first direction;
each of said fixing hooks belonging to said first and second fixing hook arrays being arranged for insertion into each of said sprocket holes and including;
a pillar upstanding from said recess, said pillar having an upper surface and first, second, third and fourth side surface, said first and third side surfaces defining a a first length of said pillar extending in said first direction, said second and said fourth side surfaces defining a second length of said pillar extending in said second direction, said first length of said pillar being shorter than a corresponding dimension of an associated one of said sprocket holes in said first direction, and said second length of said pillar being shorter than a corresponding dimension of said associated one of said sprocket holes in said second direction;
a projecting portion extending in said first direction from an upper section of one of said first and third side surfaces of said pillar, and having a tapered upper surface declining continuously from said upper surface of said pillar to form a tip; and
a protrusion extending in said second direction and away from one of said second and fourth side surfaces of said pillar, said protrusion being on a lower section of said one of said first and second surfaces and having a varied length in said first direction such that said length of said protrusion decreases from said one of said first and second surface, and said protrusion having a width such that said film carrier type semiconductor device is installed on said carrier in a precise position, a spacing being formed in said sprocket holes between said protrusion and said insulating base film.

2. A carrier for mounting a film carrier type semiconductor device of claim 1, in which said protrusion has a tapered upper surface declined from said one of said second and fourth side surfaces to a tip portion thereof.

3. A carrier for mounting a film carrier type semiconductor device of claim 2, in which said tapered upper surface of said protrusion is continuously formed from said upper surface of said pillar.

4. A carrier for mounting a film carrier type semiconductor device of claim 1, in which said length of said protrusion at said one of said second and fourth side surfaces of said pillar is shorter than said first length of said pillar.

5. A carrier for mounting a film carrier type semiconductor device of claim 1, in which said protrusion is protruded in said second direction with a semicircular cross sectional shape.

6. A carrier for mounting a film carrier type semiconductor device of claim 1, in which said protrusion extends in said second direction with a triangular cross sectional shape.

7. A carrier for mounting a film carrier type semiconductor device of claim 1, in which said protrusion extends in said second direction with a trapezoidal cross sectional shape.

8. A carrier for mounting a film carrier type semiconductor device of claim 1, in which said protrusion extends in said first direction with a width in said second direction which is the same as said width of said pillar.

9. A carrier for mounting a film carrier type semiconductor device of claim 1, in which said spacing between said tip and said insulating base film in said sprocket hole i in the range of 0.05 mm to 0.15 mm.

10. A carrier mechanism for cooperating with a film carrier having a base film with a central opening for receiving and mounting a semiconductor device therein, and with at least two film positioning sprocket holes formed in said base film for accurately locating said base film, said carrier mechanism comprising a substrate having a recess for receiving said base film, said recess having an opening at least a pair of position fixing hooks in said recess for receiving said two sprocket holes, each of said position fixing hooks comprising a pillar having a cross section which is smaller than the cross section of an associated one of said sprocket holes of that said pillar may easily pass through and project beyond said associated one of said sprocket holes with a minimum chance for deforming said base film, a protrusion extending outwardly along a first vertical side face of said pillar, the cross section of said protrusion being shaped to make a minimal contact with an edge of said sprocket hole in order to greatly reduce the change for a mechanical distortion at that edge, and said pillar cross section further having a projection extending outwardly from an upper part of a second vertical side face of said pillar, said first and second side faces being perpendicularly oriented on said pillar with respect to each other, said projection hooking over and engaging a relatively small portion of a confronting edge of said sprocket hole.

11. The carrier mechanism of claim 10 wherein said cross section of said protrusion is a geometric shape taken from a group consisting of a semi circle, a triangle, or a trapezoid.

12. The carrier mechanism of claim 10 wherein said projection has a surface parallel to said confronting edge so that said projection engages said confronting edge along an incremental length thereof.

* * * * *